(12) United States Patent
Lee

(10) Patent No.: US 7,378,702 B2
(45) Date of Patent: *May 27, 2008

(54) VERTICAL MEMORY DEVICE STRUCTURES

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 0 days.

This patent is subject to a terminal disclaimer.

(21) Appl. No.: 10/934,270

(22) Filed: Sep. 3, 2004

(65) Prior Publication Data

US 2005/0280061 A1 Dec. 22, 2005

Related U.S. Application Data

(63) Continuation-in-part of application No. 10/873,969, filed on Jun. 21, 2004, now Pat. No. 7,052,941.

(51) Int. Cl.
*H01L 27/108* (2006.01)
(52) U.S. Cl. .................. 257/296; 257/295; 257/315
(58) Field of Classification Search ............. 438/152, 438/153; 257/118, 199, 314, 315, 296, 295
See application file for complete search history.

(56) References Cited

U.S. PATENT DOCUMENTS 6,943,067 B2 * 9/2005 Greenlaw ............... 438/152

* cited by examiner

*Primary Examiner*—Andy Huynh
*Assistant Examiner*—Thinh T Nguyen
(74) *Attorney, Agent, or Firm*—Schmeiser, Olsen & Watts LLP

(57) ABSTRACT

Vertically oriented semiconductor memory cells are added to a separately fabricated substrate that includes electrical devices and/or interconnect. The plurality of vertically oriented semiconductor memory cells are physically separated from each other, and are not disposed within the same semiconductor body. The plurality of vertically oriented semiconductor memory cells can be added to the separately fabricated substrate as a thin layer including several doped semiconductor regions which, subsequent to attachment, are etched to produce individual doped stack structures, which are then supplied with various dielectric coatings, gate electrodes, and contacts by means of further processing operations. Alternatively, the plurality of vertically oriented semiconductor memory cells may be completely fabricated prior to attachment. DRAMs, SRAMs, non-volatile memories, and combinations of memory types can be provided.

17 Claims, 34 Drawing Sheets

VERTICAL MEMORY DEVICE STRUCTURES

CROSS REFERENCE TO RELATED APPLICATIONS

This is a continuation-in-part of application Ser. No. 10/873,969, entitled "Three-Dimensional Integrated Circuit Structure and Method of Making Same", filed 21 Jun. 2004; and which is incorporated in its entirety herein by reference.

FIELD OF THE INVENTION

The present invention relates generally to semiconductor structures and manufacturing methods for memory devices and circuits. More particularly, the present invention relates to a semiconductor substrate combined with a relatively thin add-on semiconductor layer in which various vertically oriented memory elements are fabricated.

BACKGROUND OF THE INVENTION

Advances in semiconductor manufacturing and digital systems architecture have provided the means to produce chips, or integrated circuits, with many millions of active and passive circuit elements along with the interconnects needed to create the desired circuit networks. As is well-known, integrated circuits contain transistors that are primarily implemented on a single major surface of a substrate, such as a semiconductor wafer. These laterally oriented devices consume significant amounts of chip area. Over a number of years, manufacturing advances related to transistors and interconnects have primarily been directed to reducing the lateral dimensions thereof, so that more circuitry per unit area could be placed on a chip. However, the manufacturing equipment and technologies required to support the manufacture of such highly integrated chips becomes increasingly expensive with each new generation of smaller devices.

What is needed are structures and methods that are suitable for providing increased circuit density in integrated circuits without necessarily requiring devices to be made smaller.

SUMMARY OF THE INVENTION

Briefly, a plurality of vertically oriented semiconductor memory devices, or cells, may be added to a separately fabricated substrate that includes electrical devices and/or interconnect lines. The plurality of vertically oriented semiconductor memory devices, or cells, are physically separated from each other, and therefore are not disposed within a common semiconductor body, or semiconductor substrate. The regions around and between the vertically oriented memory devices, or cells may have dielectric material disposed therein.

In one aspect of the present invention, the plurality of vertically oriented semiconductor memory devices, or cells, are added to the separately fabricated substrate as a thin layer including several doped semiconductor regions which, subsequent to attachment to the substrate, are etched to produce individual doped stack structures. These individual, vertically oriented, doped stack structures are, in various embodiments, fitted out with a variety of structures, such as but not limited to gate dielectric films, gate electrodes, capacitor terminals, contacts, charge trapping multi-layer films, and floating gates. In other embodiments of the present invention, the plurality of vertically oriented semiconductor memory cells may be fabricated prior to attachment to the separately fabricated substrate.

In another aspect of the present invention, Dynamic Random Access Memory (DRAM) cells, Static Random Access Memory (SRAM) cells, non-volatile memory cells, and similar structures may be formed in a stackable add-on layer for use in conjunction with the separately fabricated substrate.

DETAILED DESCRIPTION

Figure 1:
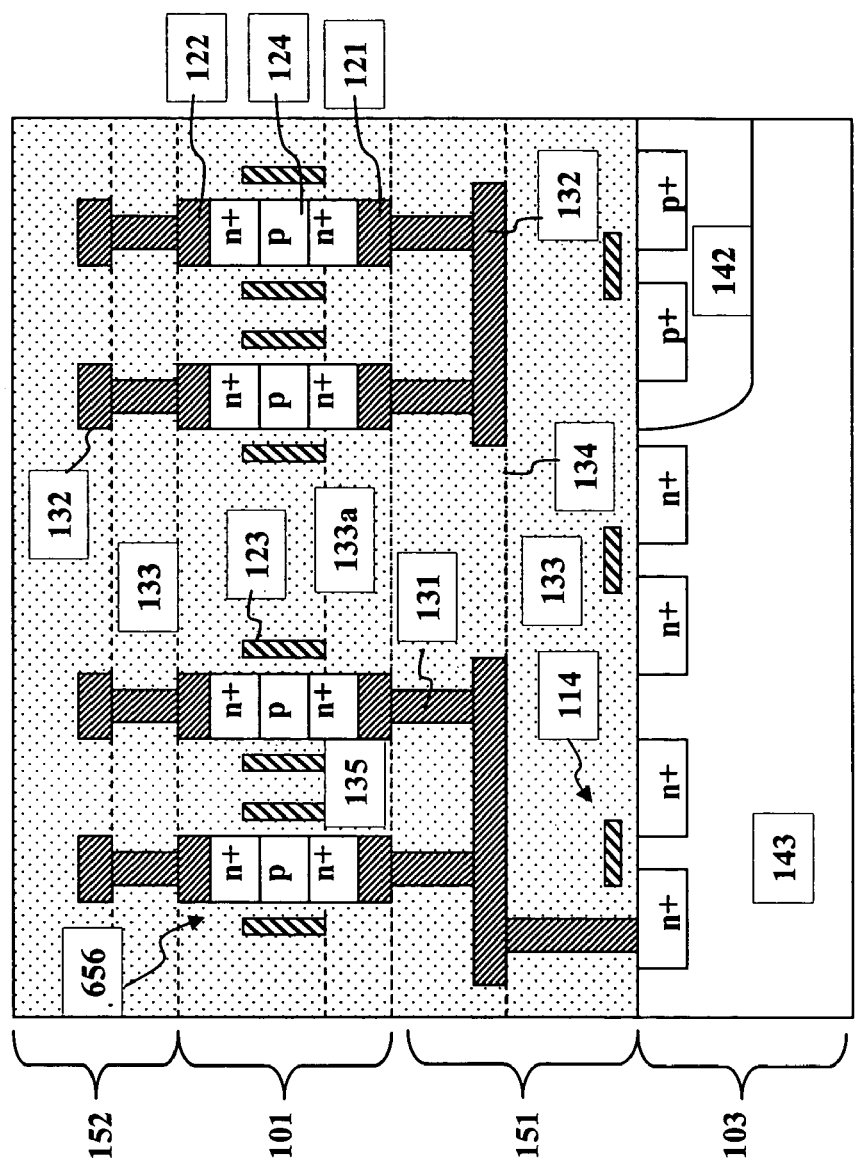
FIG. 1 is a cross-sectional view of an embodiment the present invention that includes a base semiconductor substrate and add-on vertical memory devices.

Vertically oriented memory structures constituting memory cells, or portions thereof, in a 3-D integrated circuit arrangement in accordance with the present invention, are shown in FIG. 1. Embodiments of the present invention provide a device integration architecture and technology. More particularly, memory cells, or portions thereof, which are vertically oriented with respect to a major surface of a wafer, are provided so that the effective device density, i.e., devices per unit area of the wafer surface, is increased. In this way, greater functionality can be provided in a chip of a given surface area.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The term "vertical", as used herein, means substantially perpendicular to a major surface of a substrate, such as, for example, a semiconductor wafer.

The term "Vbias" refers to an applied voltage during operation of an illustrated device. Vbias may be ground, or "0" volts, but is not required to be. The acronym "WL" refers to Word Line, and the acronym "BL" refers to Bit Line. The term "$V_{DD}$" refers to a positive supply voltage. The acronym "SoC" refers to System on a Chip, with "SoCs" being the plural of SoC.

The terms chip, semiconductor device, integrated circuit, LSI device, monolithic integrated circuit, ASIC, SoC, microelectronic device, and similar expressions are sometimes used interchangeably in this field. Microelectronic device may be considered to be the broadest term, encompassing the others. With respect to these microelectronic devices, signals are typically coupled between them and other circuit elements via physical, electrically conductive connections. The point of connection is sometimes referred to as an input, output, terminal, line, pin, pad, port, interface, or similar variants and combinations.

The term "device", as used herein, refers to active and passive circuit elements. "Device" includes, but is not limited to, FETs (n-channel and p-channel), Thyristor, capacitors, varactors, floating gates, charge trap layers, diodes, and resistors.

FET as used herein, refers to metal-oxide-semiconductor field effect transistors (MOSFETs). These transistors are also known as insulated gate field effect transistors (IGFETs). FETs are generally described as three terminal devices having a gate, a source and a drain. Although FETs may be further described as four terminal devices when the body of the FET is considered.

Source and drain terminals refer to the terminals of a FET, between which conduction occurs under the influence of an electric field, subsequent to the inversion of the semiconductor surface under the influence of an electric field resulting from a voltage applied to the gate terminal.

The acronym "SOI" generally refers to Silicon-on-Insulator. As will be appreciated by those skilled in this field, SOI layers can be formed in a variety of ways. Unless otherwise noted, "SOI layer" is used herein to refer to a relatively thin, single crystal portion of a semiconductor wafer that can be cleaved and bonded to another previously fabricated wafer, or similar type of substrate, such that a three dimensional stack is formed from the SOI layer and the previously fabricated wafer or similar type of substrate. In this context, the SOI layer may be thought of as an attachment layer, or stackable add-on structure which is suitable for bonding to a semiconductor substrate already containing devices and/or interconnections. As a stackable add-on layer, the single-crystal layer may have been doped so as to have one or more doped regions vertically adjacent each other. For purposes of this disclosure, doped regions may include intrinsic regions as well as p-type and n-type regions. Individual semiconductor structures may be formed by etching through portions of the doped stack to electrically isolate those structures. These structures may be fitted with contacts, dielectric coatings, or films, gate electrodes, capacitor terminals, and so on. The spaces between such individual structures may be filled with dielectric material so as to re-form a layer without gaps or voids therein, and thereby provide for mechanical stability, and support for additional stacked layers. Various interconnect layers may be formed and patterned at intermediate levels of the dielectric material. In this way, the stackable add-on layer may provide a plurality of memory cells suitable for connections to an underlying substrate.

The expression "high dielectric constant" refers to a dielectric constant that is greater than the dielectric constant of silicon dioxide.

The expression "3-D IC", as used herein, refers to a three-dimensional integrated circuit that includes a semiconductor substrate having devices and/or interconnect structures fabricated thereon, and least one stackable add-on layer, also having devices and/or interconnect, where the semiconductor substrate and the stackable add-on layer are stacked and bonded to each other.

As shown in FIG. 1, vertical memory devices 656 in accordance with the present invention are separated by isolation 135 and have floating structures in the filled dielectric materials 133a. Vertical memory devices 656 are referred herein to as floating devices (FLD). Embodiments of the present invention are different from a conventional bonded IC layer, which has a shared well 142 or substrate 143, wherein an electrically common region is located. Additionally, embodiments of the present invention do not have the physically supporting layer which can be found in a conventional SOI IC substrate where all devices in one IC layer are supported by a substrate under a bottom oxide. The layer that includes FLD 656 is called FLD layer 101. Inter-layer dielectric (ILD) layers 133 disposed above and below FLD layer 101 have interconnection lines 132 and vias, or contacts, 131. Interconnection lines 132 and vias 131 connect FLDs directly or indirectly within an FLD layer, or connect devices from an FLD layer to another FLD layer or to a base substrate.

Still referring to FIG. 1, the substrate bonded to lower dielectric layer 151 is called base substrate 103. The first FLD layer above base substrate 103 is called first FLD layer 101, and the next FLD layer is called second FLD layer (not shown).

FIG. 1 shows one FLD layer 101 and one base semiconductor substrate 103. Dashed line 134 denotes a border, or interface, of two ILD layers. First ILD layer 151 has interconnection lines and vias, and base semiconductor substrate 103 shares these interconnections and vias with first FLD layer 101. Some vias may directly connect to second FLD layer (not shown) from first ILD layer 151. Also interconnection lines and vias in second ILD layer 152 are shared by first FLD layer 101 and second FLD layers.

Still referring to FIG. 1, the formation of electrodes to floating memory device 656 is by direct connection to the top 122 and bottom 121 of each floating memory device 656. Also, in various embodiments of the present invention, floating devices may be constructed that have vertically separated single or more intermediate electrodes 123. These electrodes could be connected to interconnection lines within ILD layers 151, 152 disposed on the top and/or bottom of the FLD layer.

In FIG. 1, a logic circuit 114 including sense amplifier and column/row selectors may be implemented in base semiconductor substrate 103 while nonvolatile memory devices are implemented in first FLD layer 101, and SRAM devices are in a second FLD layer, in which case one semiconductor substrate could integrate different types of individually optimized devices without using a difficult and expensive SoC structures or semiconductor processes.

Various embodiments of the present invention do not require a physically supporting substrate for floating devices. Also, without a base substrate, various embodiments could exist along with interconnection lines, vias, and FLDs only.

Various embodiments of the present invention provide floating devices that are separated by dielectric isolation regions. These electrically separated structures do not have the parasitic devices which are typically found in prior art approaches.

Various embodiments of the present invention provide floating devices that may be connected directly or indirectly.

In various embodiments of the present invention, combining the SOI layer with a semiconductor substrate does not require the same type of wafer alignment structures as are used in photolithographic processes, rather, the wafer alignment structure may be implemented as a wafer alignment mark, or as a bump-type alignment structure. Alternatively, without a wafer alignment structure, the SOI layer could be transferred along with a simple notch alignment because the transferred SOI layer does not have structures for multiple devices, such as isolation structure or interconnection lines, which are horizontally divided. The transferred, unpatterned, SOI layer has only a vertically oriented stack of layers.

In various embodiments of the present invention, a FLD can be directly contacted by metal electrodes at top, bottom, and intermediate regions of the individual doped stack structures (i.e., pillar structures). The area of the metal electrodes can be the same as the top and bottom areas of individual doped stack structures of the FLD. Therefore, the voltage drop of the device due to contact resistance can be reduced as compared to conventional laterally oriented devices.

The bottom of the FLD is connected to metal layer 121 which is also directly connected to vias 131 in ILD layer 151. Therefore, the bottom of FLD essentially has a preformed electrode and contact. The top of the FLD may be connected to metal layer 122 which is also directly connected to vias 131 in ILD layer 152.

Multiple FLD layers can be stacked, thereby increasing the effective device density.

FLDs may, but are not required to, have a pillar structure. Conventional pillar type Surrounding Gate Transistor (SGT) structures are difficult to integrate with optimized horizontal (i.e., lateral, or co-planar) devices. Integration may cause the shadow effect to occur during ion implantation due to the presence of pillar type transistor structures. Also, conventional SGT structures do not provide for high integration density because of processing problems associated with forming electrodes at the source/drain and gate regions. Therefore, these conventional approaches are not suitable for SoC formation. However, the add-on pillar type SGT structures in accordance with the present invention, may be combined with conventionally processed wafers.

An FLD can be fabricated to be in full or partial depletion mode, by control of the FLD width. The depletion mode can also be controlled by the operational voltage and dielectric constant of the gate dielectric material.

An advantage of embodiments of the present invention is that because the detached surface of the SOI substrate typically corresponds to a heavily doped source/drain region of a memory, even though small surface defects may be present, there is little impact on gate oxide quality, device operation, or yield, from these surface defects.

The FLD may have a graded impurity distribution in the channel region. The graded impurity distribution in the channel region of devices in accordance with the present invention may give rise to induced electric fields that accelerate current flow and reduce the Short Channel Effect, as compared to conventional devices. The graded impurity distribution can readily be formed by ion implantation or by an epitaxial process. Increased impurity concentration in the channel region from source to drain side provides for asymmetric operation. For example, a Lightly Doped Drain (LDD) structure could be selectively formed at one of the source/drain terminals (which in operation would be the drain terminal). It is difficult to implement graded impurity distribution in the channel of conventional horizontal MOSFETs because of difficulties in high tilt ion implantation and device layout.

The FLD, in accordance with the present invention, has a gate dielectric layer which may be implemented with process operations at temperatures below 650° C. The dielectric layer could be thermal oxide, deposited oxide, oxynitride, or a combination of oxide and nitride, such as an oxide-nitride-oxide (ONO) layer, or a nitride-oxide (NO) layer. Any suitable dielectric material could be used except films requiring processing at temperatures more than 650° C. Another advantage of embodiments of the present invention is that it is easy to use high dielectric constant (high-k) materials in the gate dielectric layer, such as, but not limited to, $Al_2O_3$, $ZrO_2$, $HfO_2$, $Y_2O_3$, $La_2O_3$, $Ta_2O_5$, $TiO_2$, and BST. In conventional manufacturing of MOSFETs, a high temperature heat activation operation is required after the source/drain ion implantation. At this time, the properties of high-k materials can be altered. However, the FLD architecture does not require a high temperature process, and so high-k materials could be used at stable condition. Also, if Atomic Layer Deposition (ALD) is used to provide the gate dielectric layer, then a substantially uniform layer can be obtained.

In order to prevent diffusion of oxidant and undesired oxidation of via 131 and/or interconnection 132 during the thermal gate oxidation process, it may be desired to have moisture blocking layer below the gate insulator layer 183. The moisture blocking layer may be, but is not limited to, a nitride layer or an oxynitride film. Such a moisture blocking layer may be disposed in ILD layer 151, or dielectric layer 133a under gate insulator layer 183.

In accordance with the present invention, FET threshold voltage can be controlled by changing the gate dielectric thickness and/or the width of the FLD. If different gate dielectric thickness is used or different dielectric constant materials are used at FLD, then multiple operational voltages and threshold voltages could be implemented at the same stackable add-on layer. Also, because the FLD may be produced at low temperature, and a surrounding gate is used, it is less difficult to use a metal gate as compared to conventional manufacturing approaches.

In accordance with the present invention, memory devices could be implemented using FLDs. The following illustrative embodiments of the present invention use n-type enhancement MOSFETs. As will be appreciated by those skilled in this field, p-type and/or depletion mode FETs, or bipolar transistors could be used in various memory cell implementations.

Figure 2:
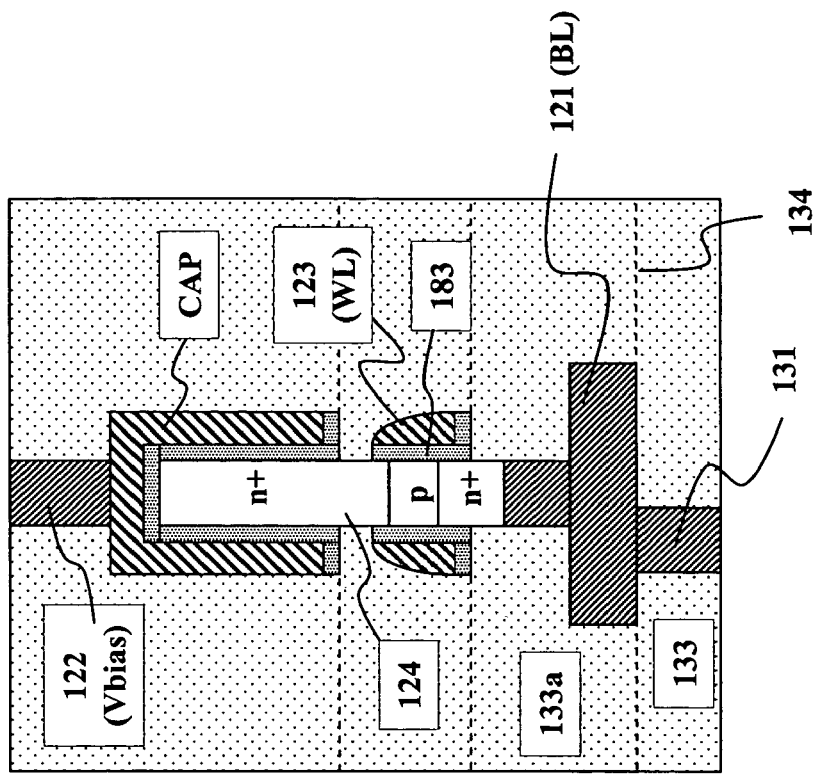
FIG. 2 is a cross-sectional view of an embodiment of the present invention having a vertical DRAM cell with vertical connection of a capacitor and a MOSFET in the SOI layer.
Figure 3:
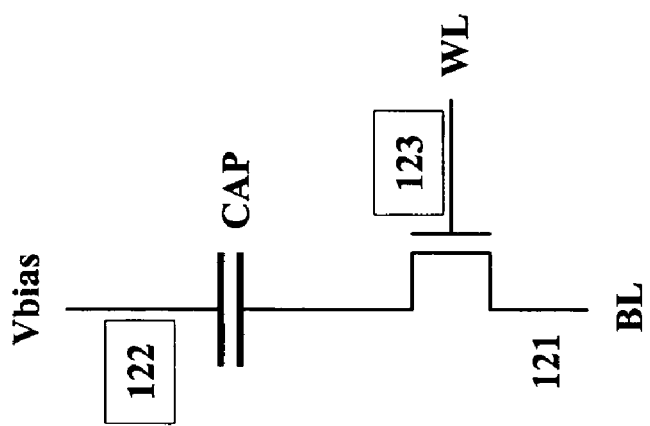
FIG. 3 is a schematic diagram of an equivalent circuit for the structure shown in FIG. 2.

FIG. 2 shows a DRAM cell with vertical connection of a capacitor and a MOSFET in the stackable add-on layer. A source/drain terminal of the access transistor is extended to the vertical capacitor. FIG. 3 shows a schematic diagram of an equivalent circuit for the structure shown in FIG. 2.

The gate insulators 183 for the transistor and capacitor in FIG. 2 are separated. However, in some embodiments these might be grown at the same time and could be used for the transistor and capacitor as a continuous gate insulator film. Multi-gate devices in accordance with the present invention may use such continuous gate insulator films.

Figure 4:
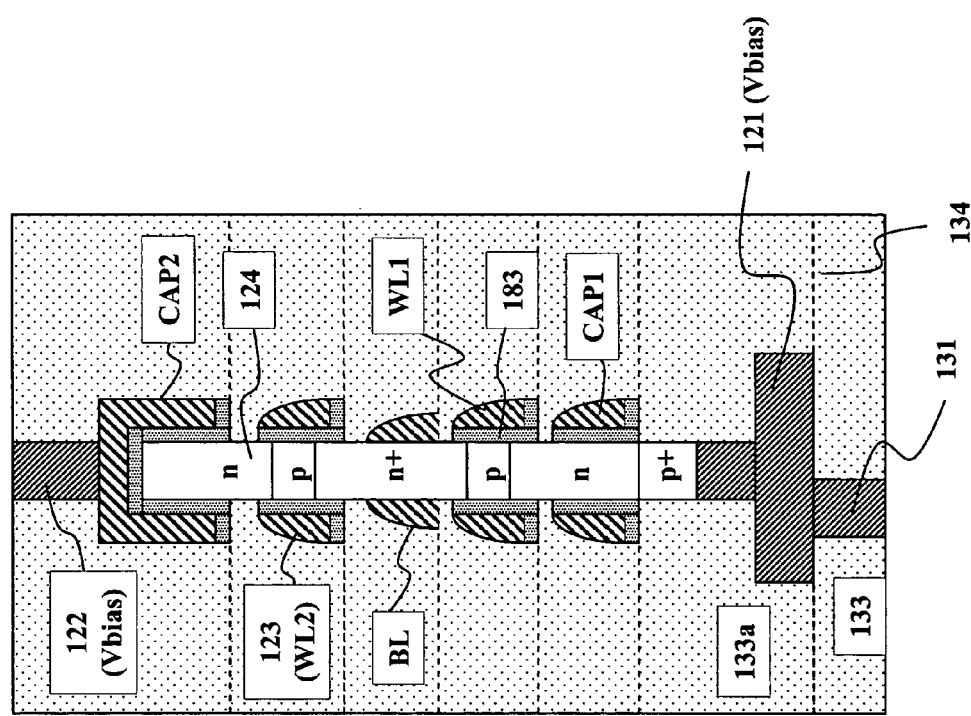
FIG. 4 is a cross-sectional view of an embodiment of the present invention having two vertical DRAM cells with vertical connection of a capacitor and a MOSFET, respectively in the SOI layer.
Figure 5:
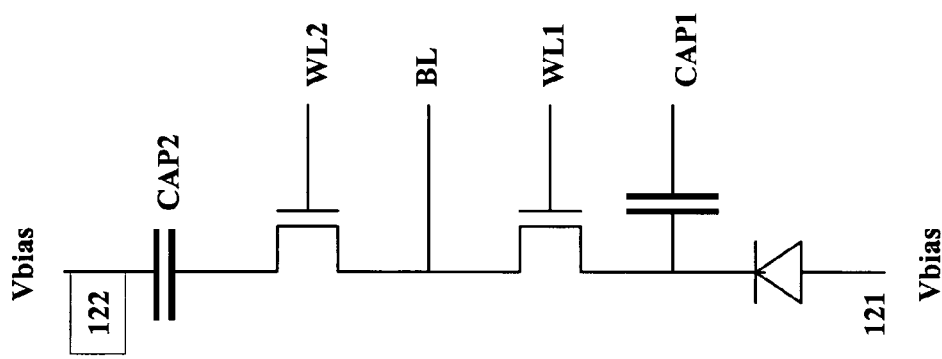
FIG. 5 is a schematic diagram of an equivalent circuit for the structure shown in FIG. 4.

FIG. 4 shows two vertical DRAM cells with vertical connection of a capacitor and a MOSFET, respectively in the stackable add-on layer. The structure shares a single bit line, therefore, the density of DRAM cells increases by a factor of two while the aspect ratio of SOI pillar 124 remains relatively small. FIG. 5 shows a schematic diagram of an equivalent circuit for the structure shown in FIG. 4.

Figure 6:
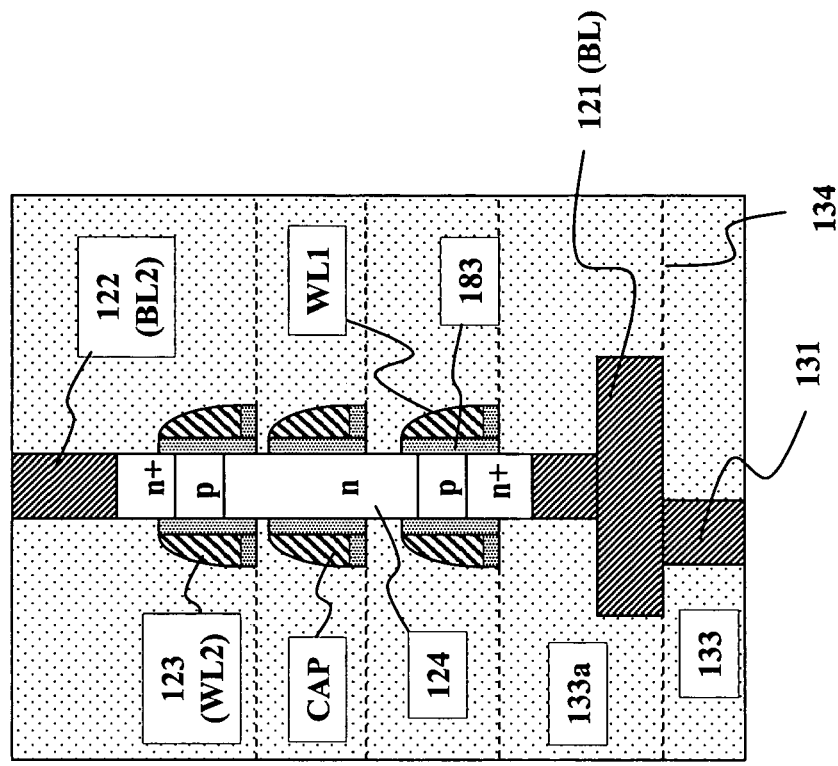
FIG. 6 is a cross-sectional view of an embodiment of the present invention having two vertical DRAM cells with vertical connection of a capacitor and two MOSFETs in the SOI layer.
Figure 7:
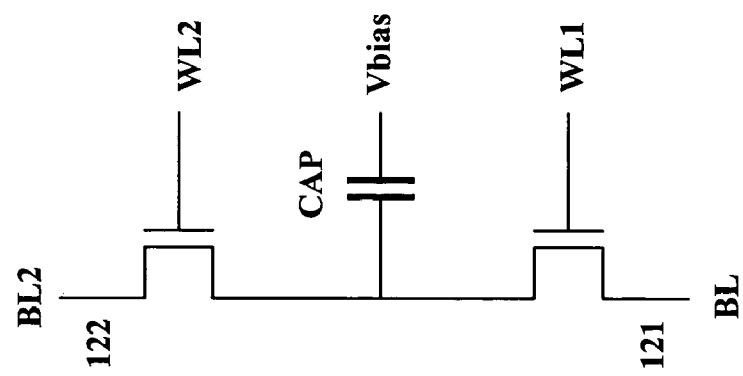
FIG. 7 is a schematic diagram of an equivalent circuit for the structure shown in FIG. 6.

FIG. 6 shows a dual port DRAM cell with vertical connection of a capacitor and two MOSFETs in the stackable add-on layer. As can be seen in FIG. 6, one capacitor CAP disposed in the central portion of SOI pillar 124 is shared by two vertical MOSFETs. In this case, the information in the shared capacitor may be accessed through the top and bottom access MOSFETs. Therefore, this structure may function as a dual-port DRAM cell. The structure of FIG. 6 increases density by a factor of two while the aspect ratio of SOI pillar 124 remains relatively small. FIG. 7 shows a schematic diagram of an equivalent circuit for the structure of FIG. 6.

Figure 8:
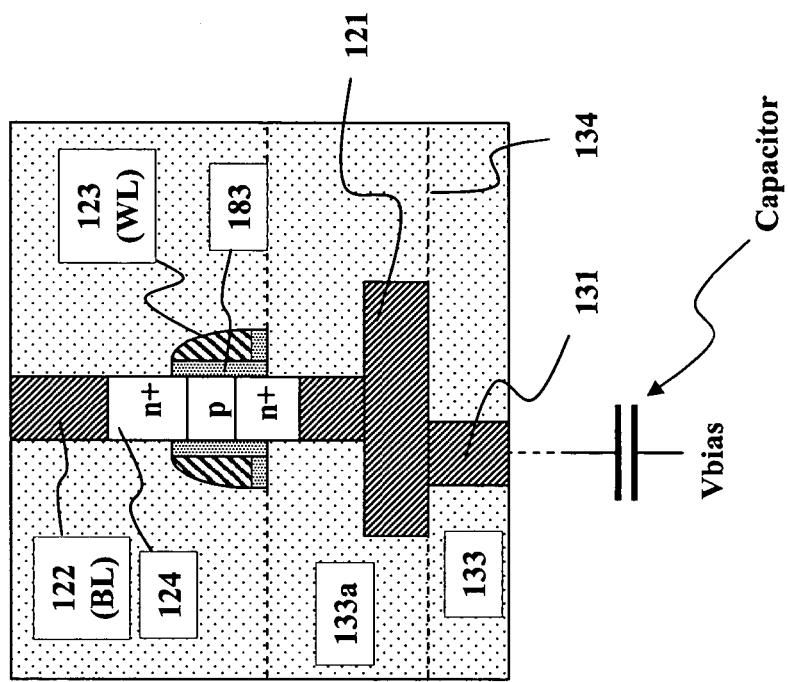
FIG. 8 is a cross-sectional view of an embodiment of the present invention having a vertical DRAM cell with vertical connection of a MOSFET in the SOI layer and an external capacitor.

FIG. 8 shows a vertical DRAM cell with vertical connection of a MOSFET in the SOI layer and a external capacitor in bottom dielectric layer 151. The capacitor may be MIM (Metal-Insulator-Metal), PIP (Poly-Insulator-Poly), MIP (Metal-Insulator-Poly), or Trench capacitor in base substrate 103. Without external capacitor, the single MOSFET in SOI pillar 124 could work as a DRAM cell because electric charge is temporarily accumulated in the body (p-region) when the body of the MOSFET is floating.

Figure 9:
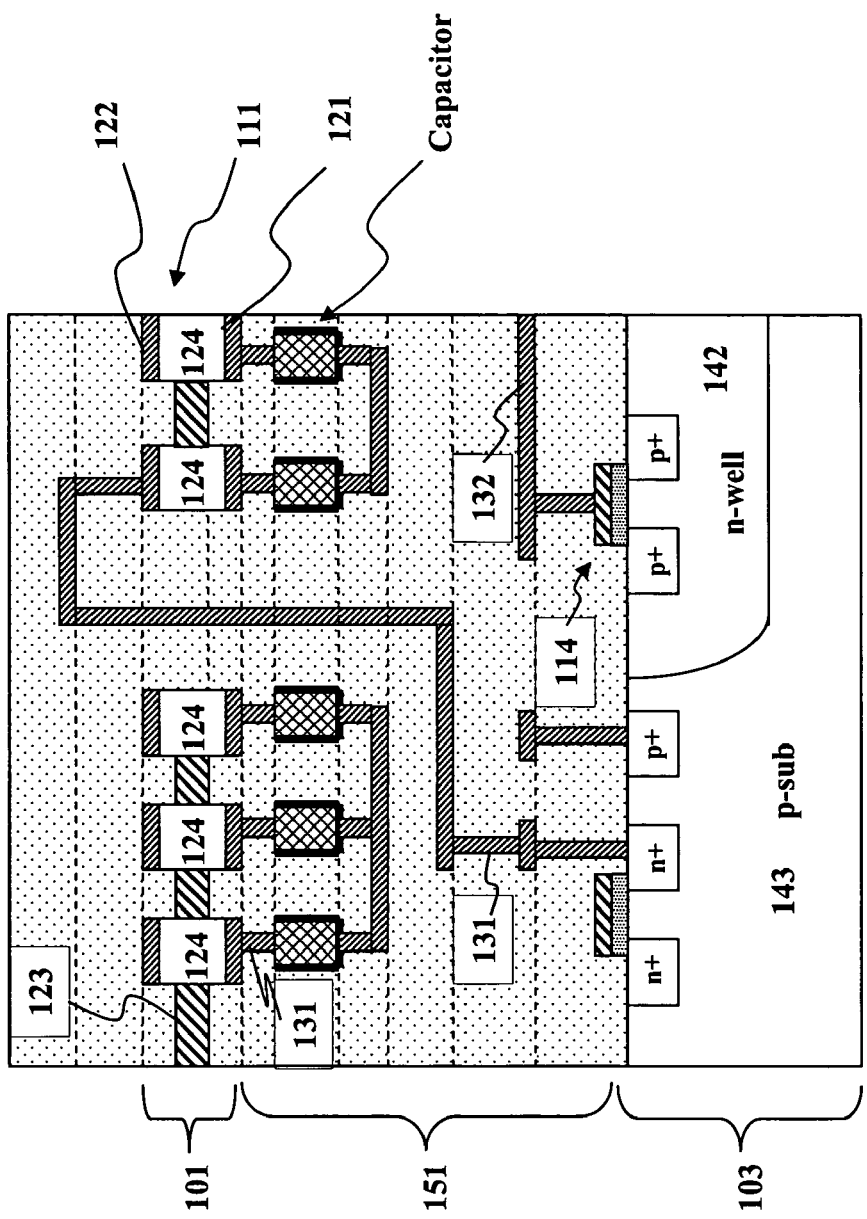
FIG. 9 illustrates an exemplary DRAM structure formed with devices illustrated in FIG. 8.
Figure 10:
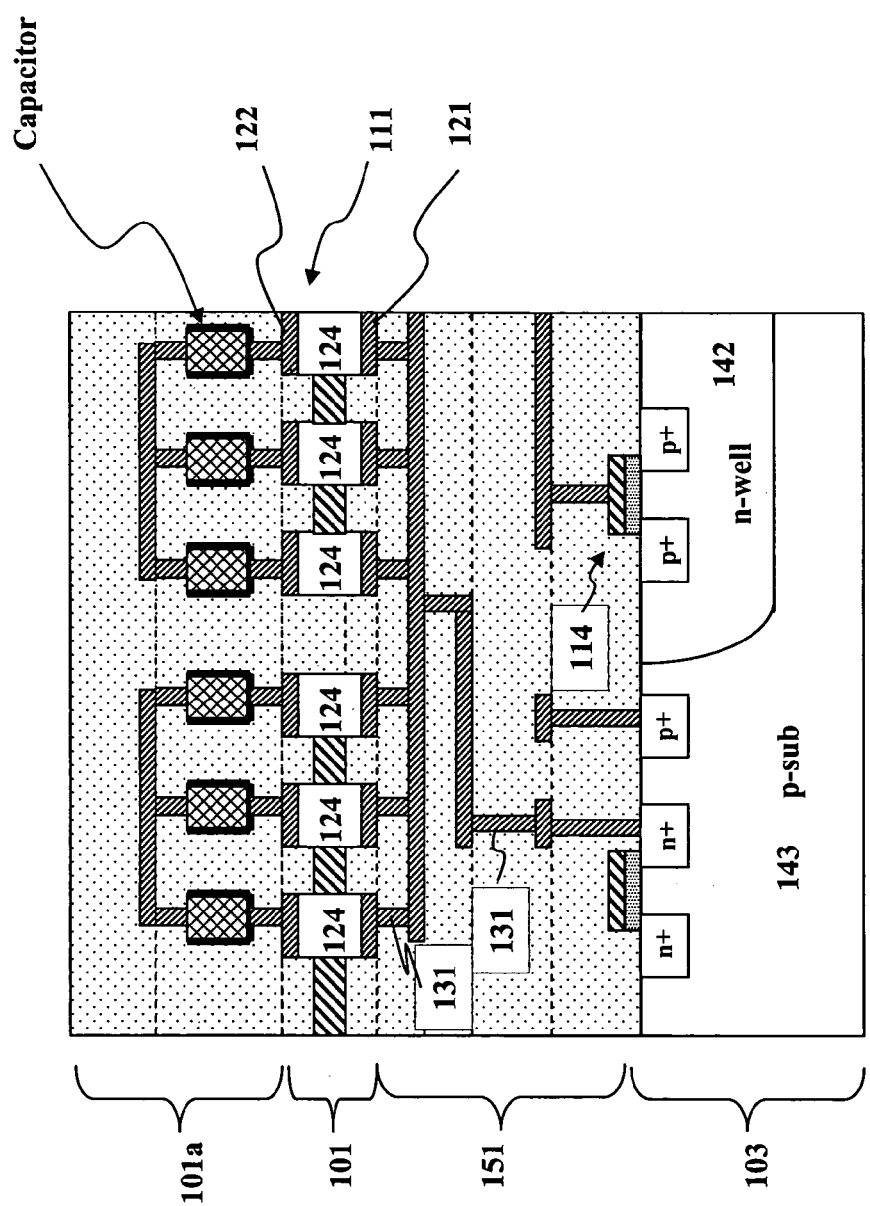
FIG. 10 illustrates an exemplary DRAM structure formed with devices illustrated in FIG. 8.
Figure 11:
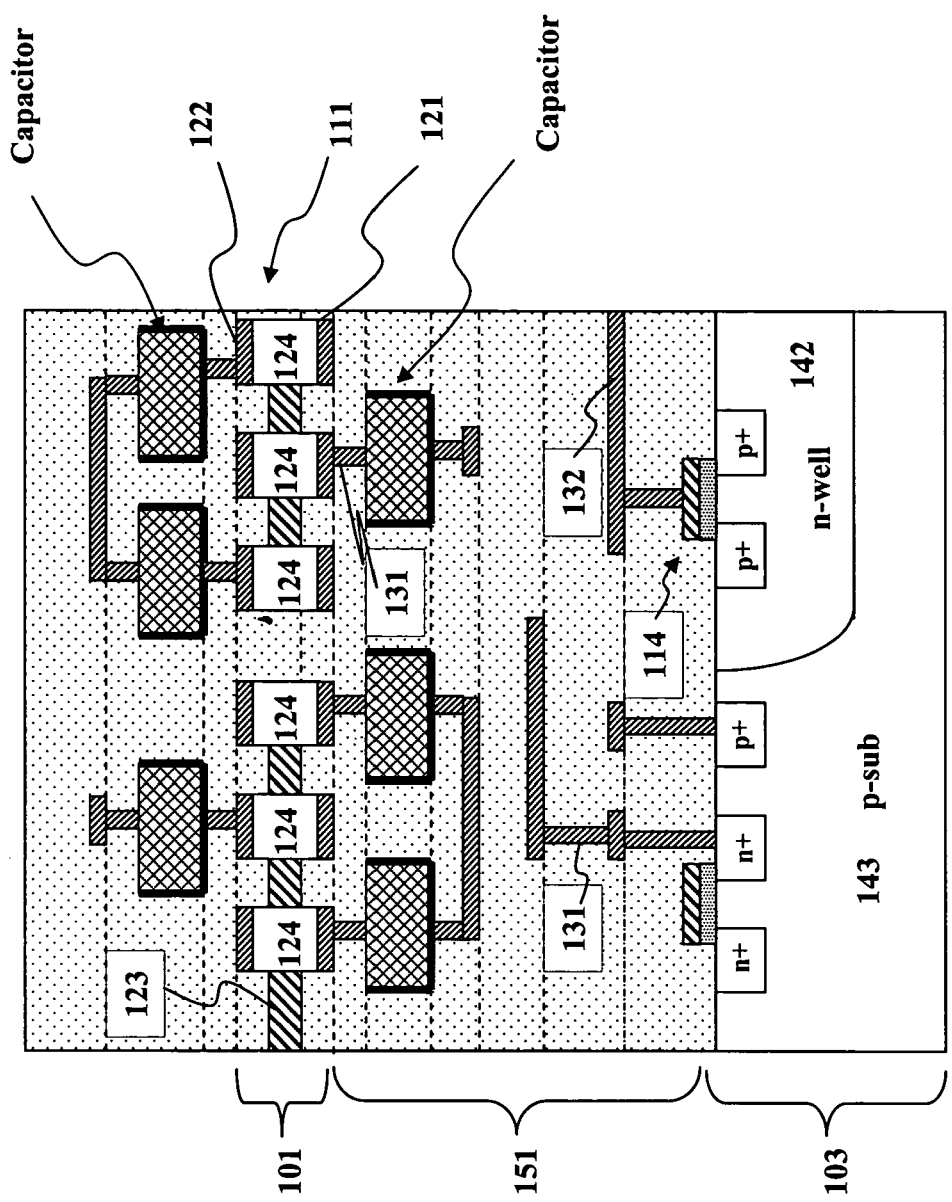
FIG. 11 illustrates another exemplary DRAM structure formed with devices illustrated in FIG. 8.

FIG. 9 illustrates an exemplary DRAM structure formed with devices illustrated in FIG. 8. The external capacitor is placed in bottom ILD layer 151. The external capacitor may alternatively be placed in top dielectric layer 152 as shown in FIG. 10. In a further alternative, the external capacitor may be placed in top 151 and bottom 152 dielectric layers as shown in FIG. 11. In this case, the capacitor takes more space to store more charge, which may increase the time between refresh cycles, and increase the effective operational speed of the DRAM.

Figure 12:
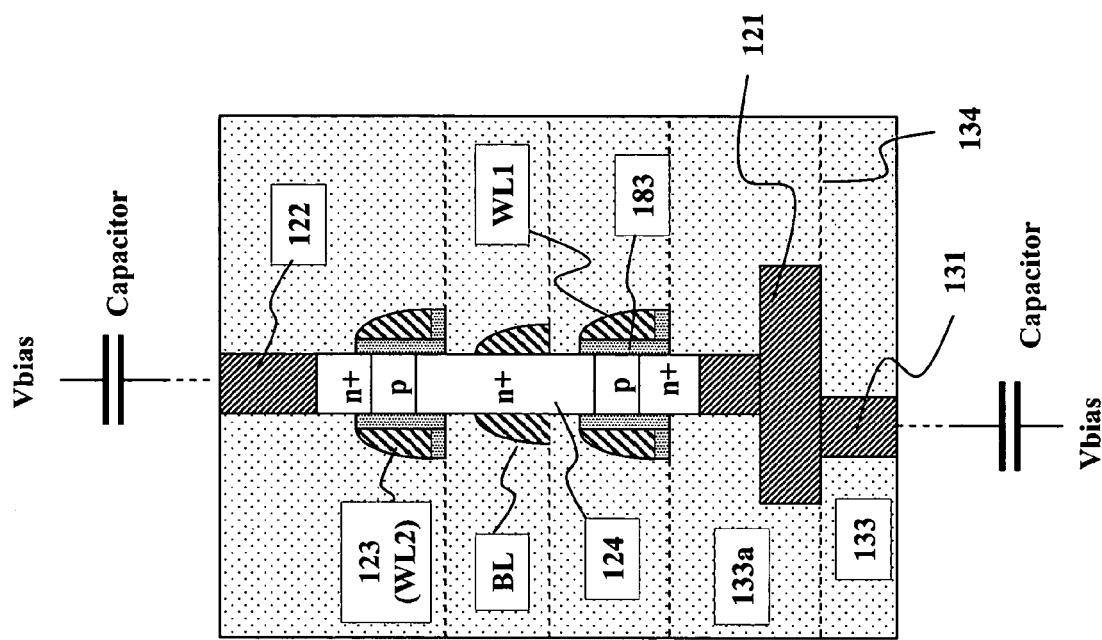
FIG. 12 is a cross-sectional view of an embodiment of the present invention having two vertical DRAM cells with vertical connection of two MOSFETs in the SOI layer and two external capacitors.
Figure 13:
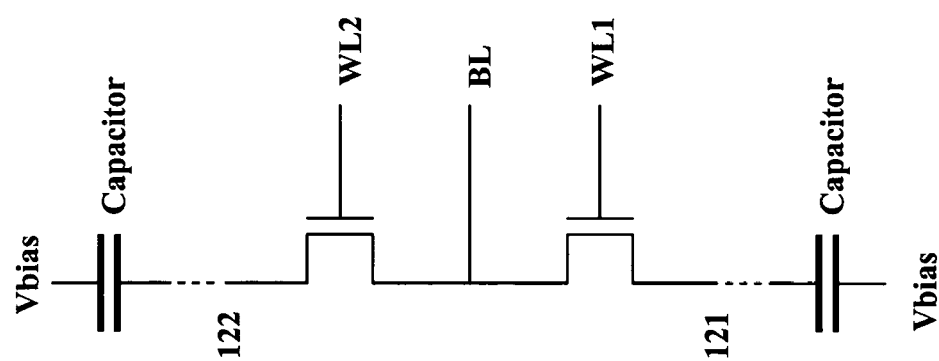
FIG. 13 is a schematic diagram of an equivalent circuit for the structure shown in FIG. 12.

FIG. 12 shows two vertical DRAM cells with vertical connection of two MOSFETs in the stackable add-on layer and two external capacitors. Without external capacitor, the MOSFETs in the SOI pillar 124 could work as a DRAM cell either as explained in FIG. 8. FIG. 13 shows a schematic diagram of an equivalent circuit for the structure shown in FIG. 12.

Figure 14:
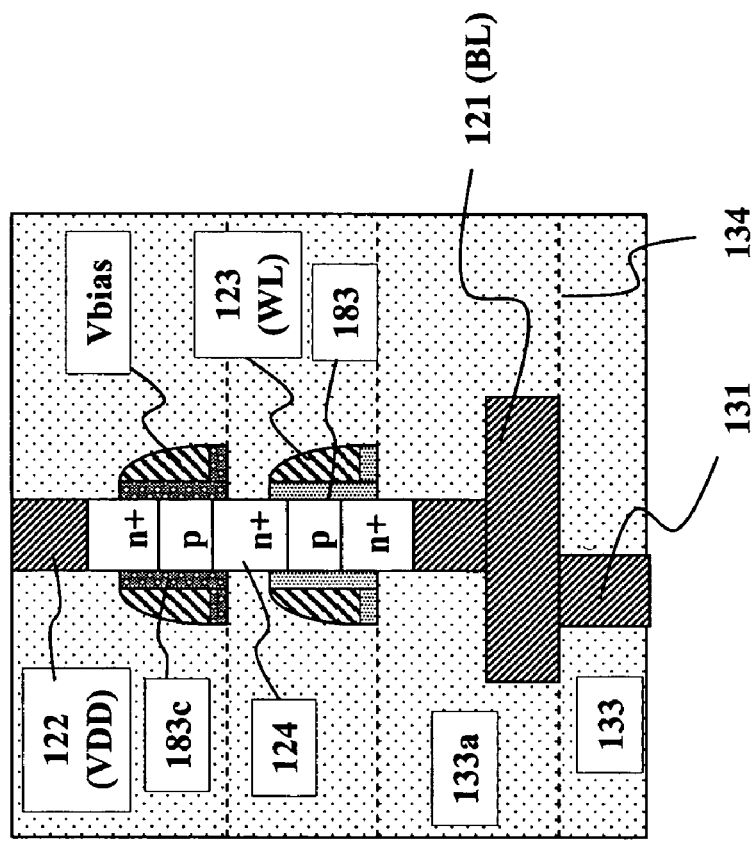
FIG. 14 is a cross-sectional view of an embodiment of the present invention having a Negative Differential Resistance (NDR) based vertical SRAM cell with vertical connection of two MOSFETs in the SOI layer.
Figure 15:
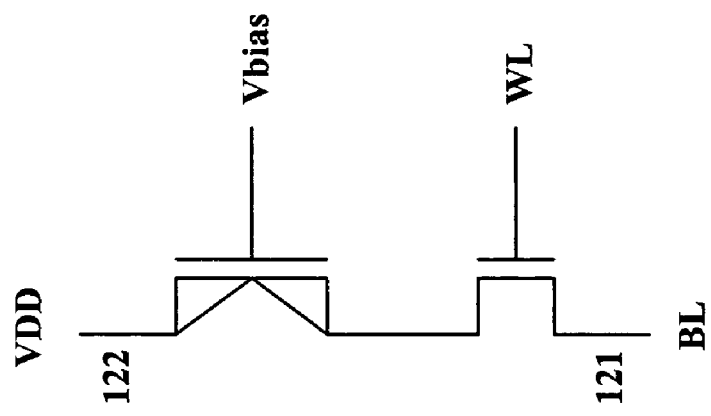
FIG. 15 is a schematic diagram of an equivalent circuit for the structure shown in FIG. 14.

FIG. 14 shows a Negative Differential Resistance based vertical SRAM cell with vertical connection of two MOSFETs in the stackable add-on layer. The top MOSFET has gate insulator 183c which induces charge trapping and discharging, and therefore, creates negative differential characteristics when the drain bias is higher than the gate bias. FIG. 15 shows a schematic diagram of an equivalent circuit for the structure shown in FIG. 14.

Figure 16:
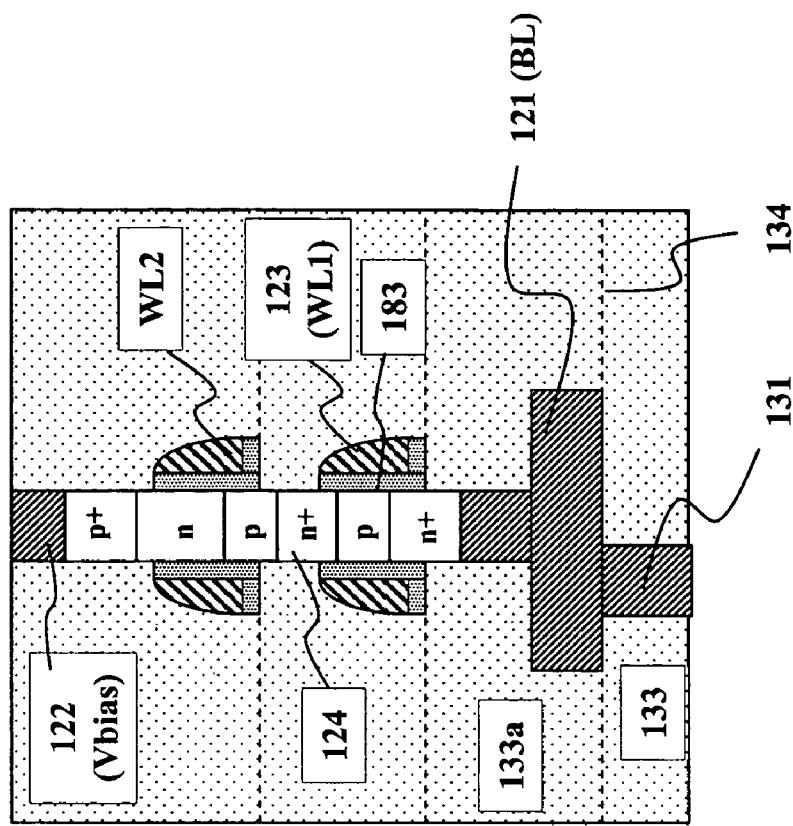
FIG. 16 is a cross-sectional view of an embodiment of the present invention having a Negative Differential Resistance based vertical SRAM cell with vertical connection of a Thyristor and a MOSFET in the SOI layer.
Figure 17:
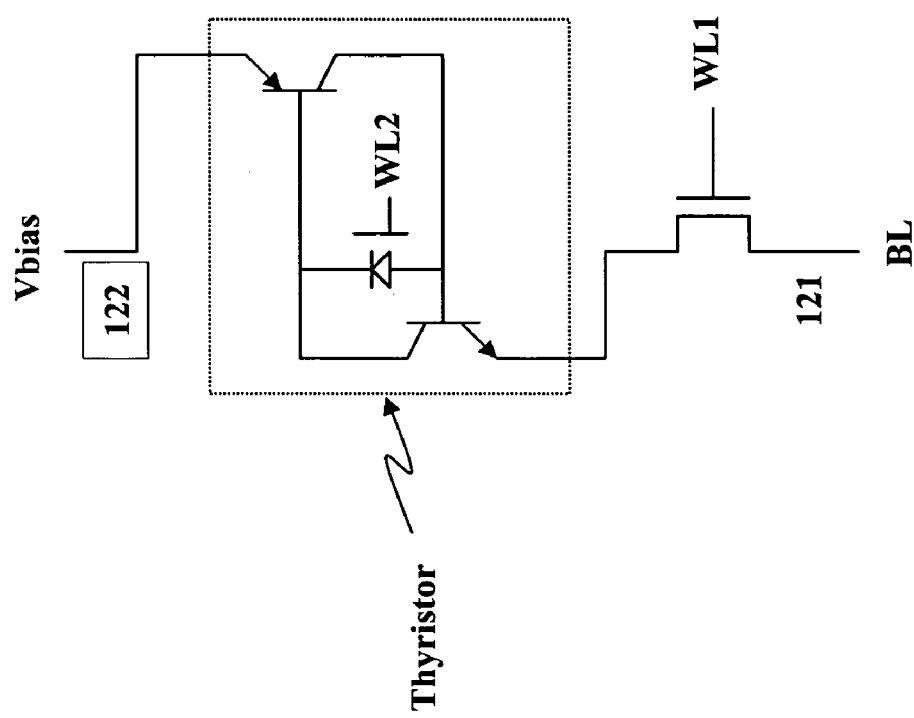
FIG. 17 is a schematic diagram of an equivalent circuit for the structure shown in FIG. 16.

FIG. 16 shows another NDR (Negative Differential Resistance) based vertical SRAM cell with vertical connection of a Thyristor and a MOSFET in the stackable add-on layer. The intermediate gate, WL2, controls diode action between p- and n-regions, therefore, it triggers snapback of the Thyristor to latch SRAM. FIG. 17 is a schematic diagram of an equivalent circuit for the structure shown in FIG. 16.

Figure 18:
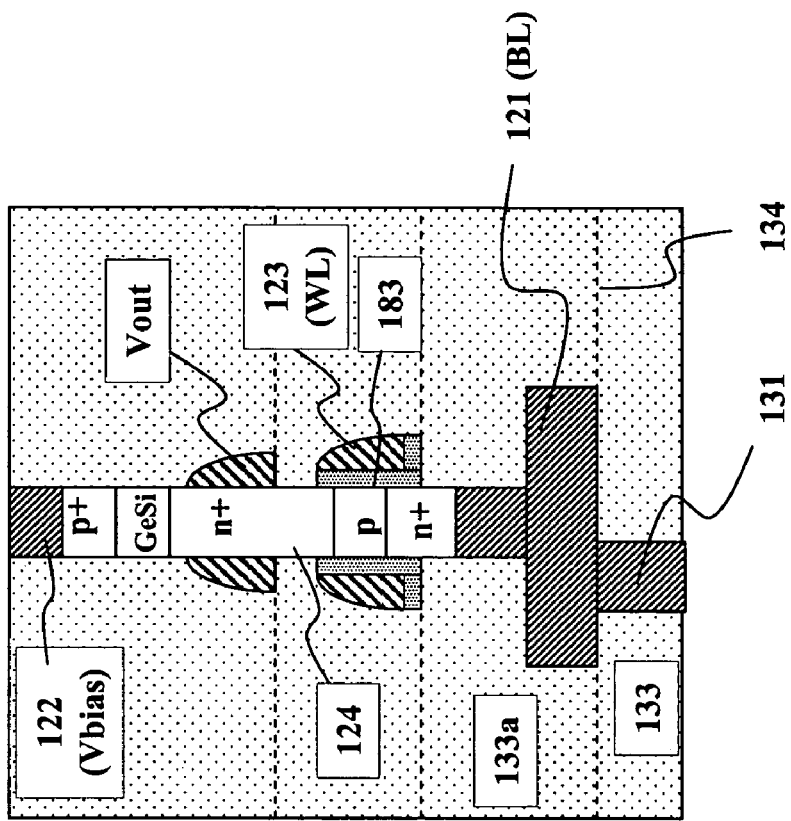
FIG. 18 is a cross-sectional view of an embodiment of the present invention having a Negative Differential Resistance based vertical SRAM cell with vertical connection of a bi-stable diode and a MOSFET in the SOI layer.
Figure 19:
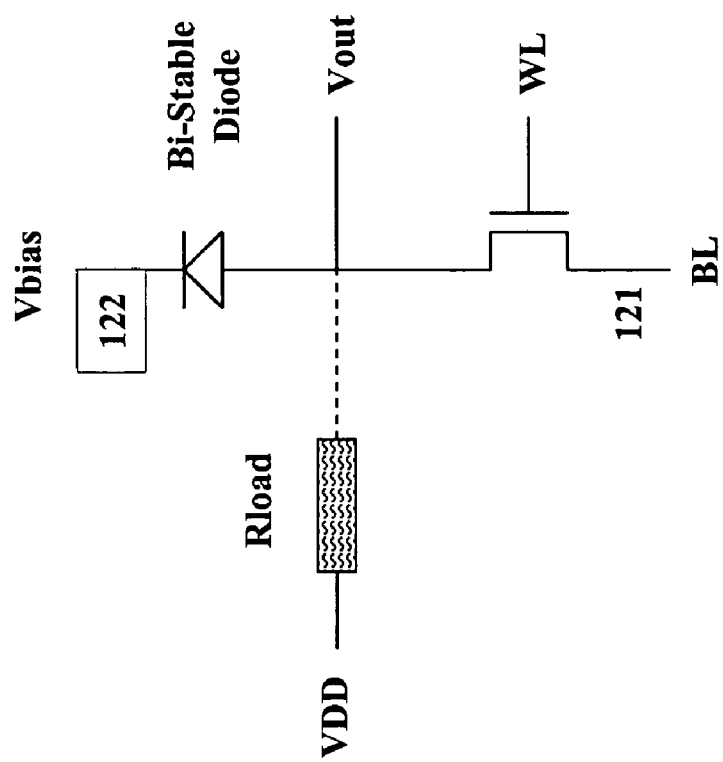
FIG. 19 is a schematic diagram of an equivalent circuit for the structure shown in FIG. 18.

FIG. 18 shows a cross-sectional view of an embodiment of the present invention having a Negative Differential Resistance based vertical SRAM cell With vertical connection of a bi-stable diode and a MOSFET in the stackable add-on layer. The bi-stale diode, which is implemented as a sandwich of p+/GeSi/n+, uses a tunneling diode property, that creates negative resistance when the applied bias goes up. Other tunneling diodes may be substituted for the p+/GeSi/n+ diode. The output node, Vout, is connected to a load resistor, Rload, or another tunneling diode. FIG. 19 is a schematic diagram of an equivalent circuit for the structure shown in FIG. 18 including load resistor Rload.

Figure 20:
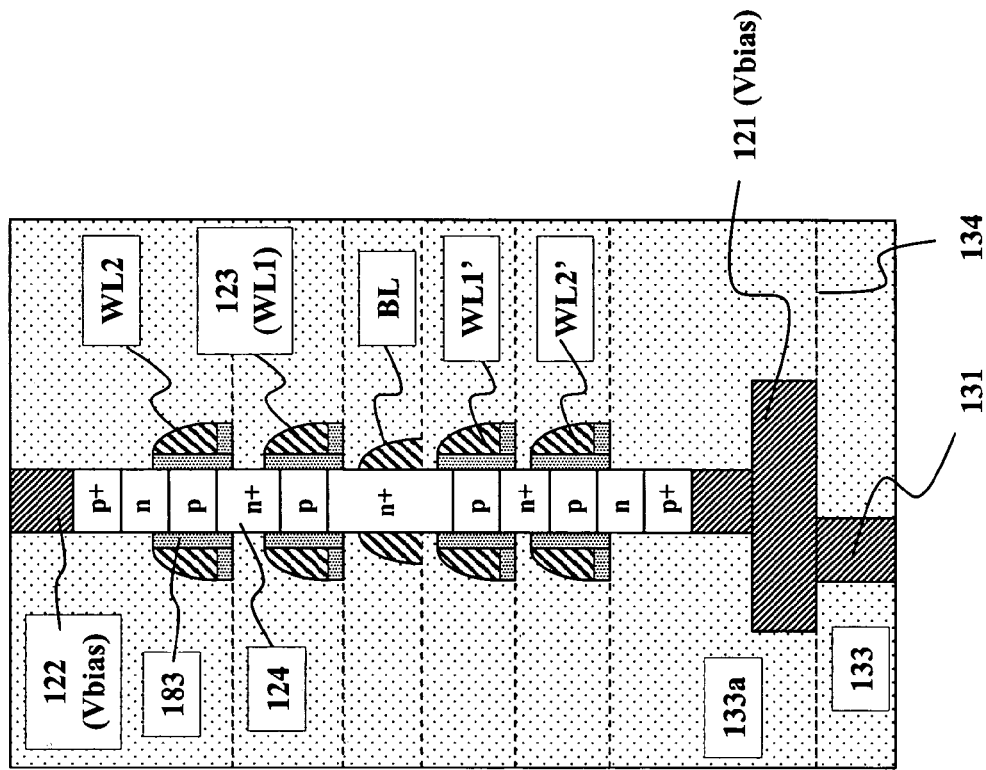
FIG. 20 is a cross-sectional view of an embodiment of the present invention having two Negative Differential Resistance based vertical SRAM cells with vertical connection of a Thyristor and a MOSFET, respectively in an SOI layer.
Figure 21:
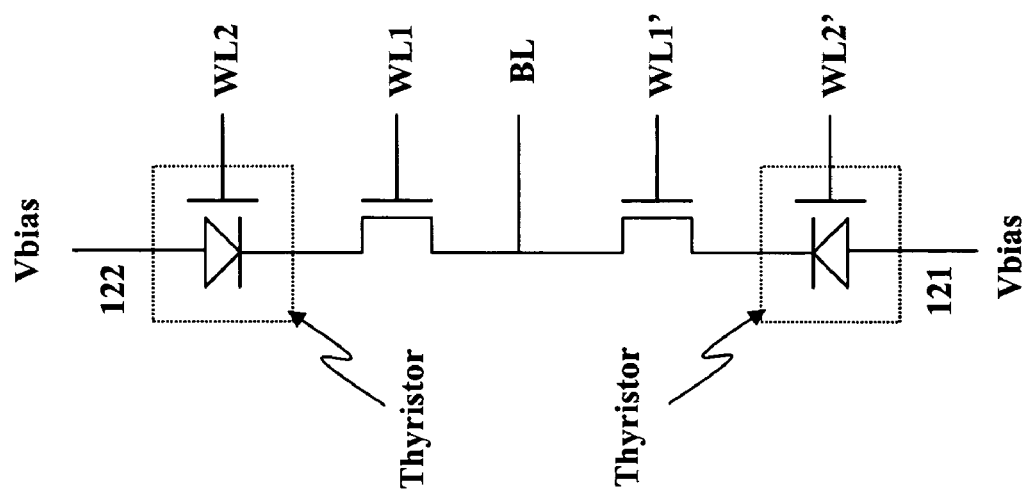
FIG. 21 is a schematic diagram of an equivalent circuit for the structure shown in FIG. 20.

FIG. 20 shows a cross-sectional view of an embodiment of the present invention having a Negative Differential Resistance based vertical SRAM cell including the vertical connection of two Thyristor/MOSFET pairs, in the stackable add-on layer. In this embodiment of the present invention, the two Thyristor-type SRAMs are stacked in vertical the direction and a bit line is shared in the middle of SOI pillar 124. FIG. 21 is a schematic diagram of an equivalent circuit for the structure shown in FIG. 20.

Figure 22:
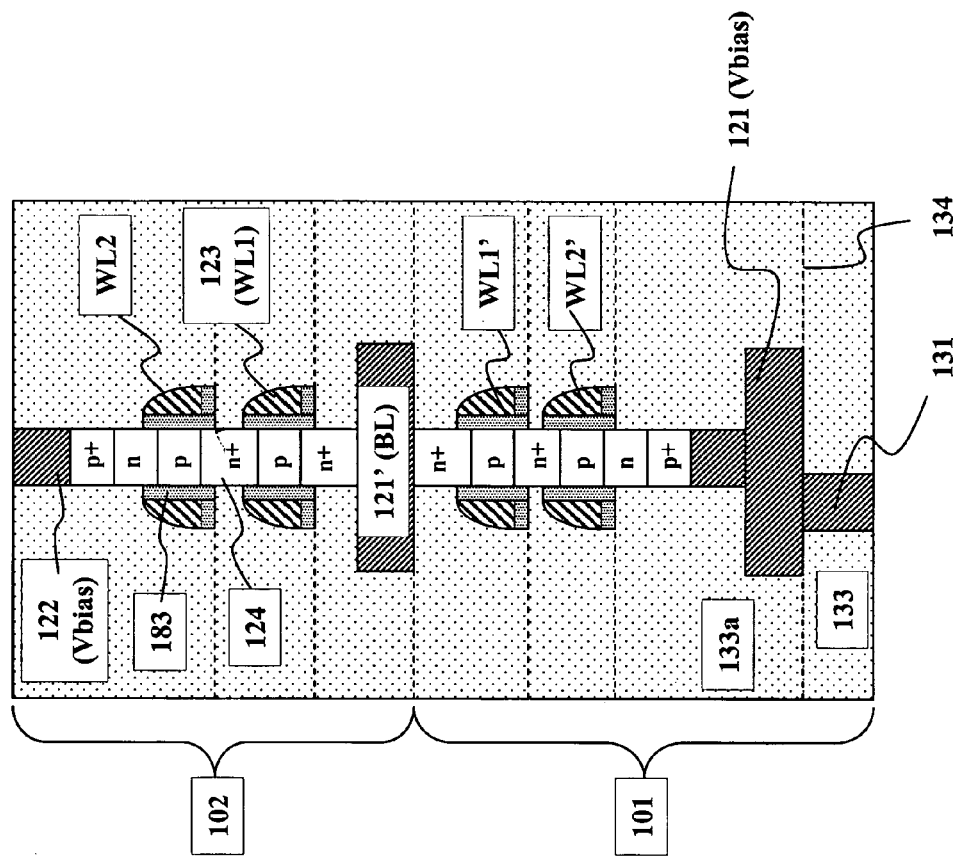
FIG. 22 is a cross-sectional view of an embodiment of the present invention having two Negative Differential Resistance based vertical SRAM cells with vertical connection of a Thyristor and a MOSFET, respectively in two SOI layers.

One drawback of the structure in FIG. 20 is its high aspect ratio, which may cause toppling during processing. Therefore, if two stackable add-on layers having a Thyristor-type SRAM cell are vertically stacked as shown in FIG. 22, the problem of high aspect ratio can be decreased.

Figure 23:
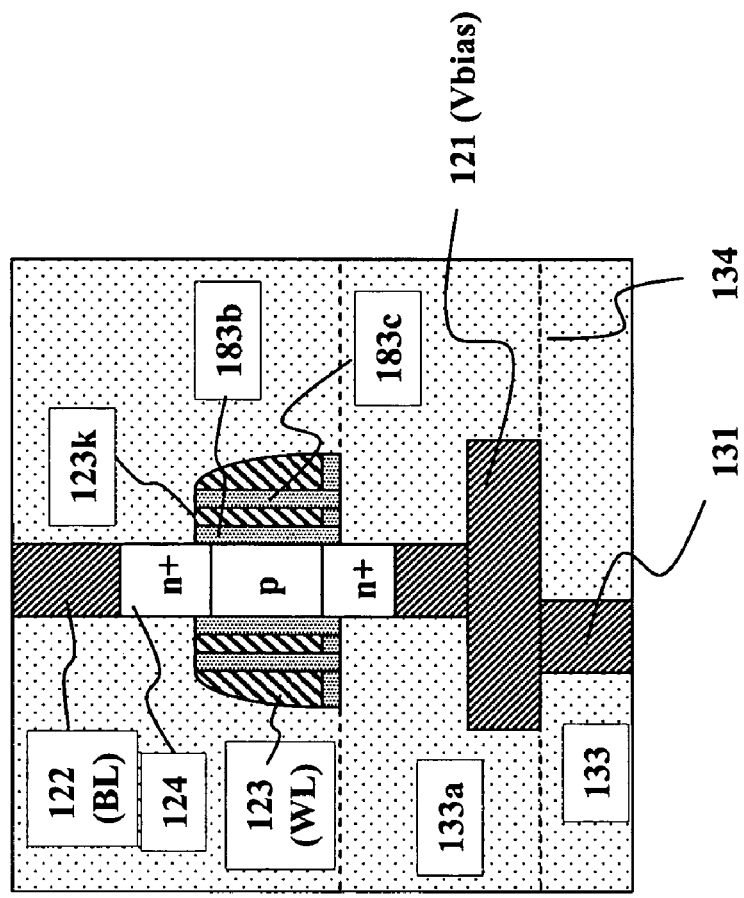
FIG. 23 is a cross-sectional view of an embodiment of the present invention having a vertical memory cell with a vertical MOSFET in the SOI layer, where the vertical memory has a floating gate and a control gate, and could work as a DRAM and a nonvolatile memory device.
Figure 24:
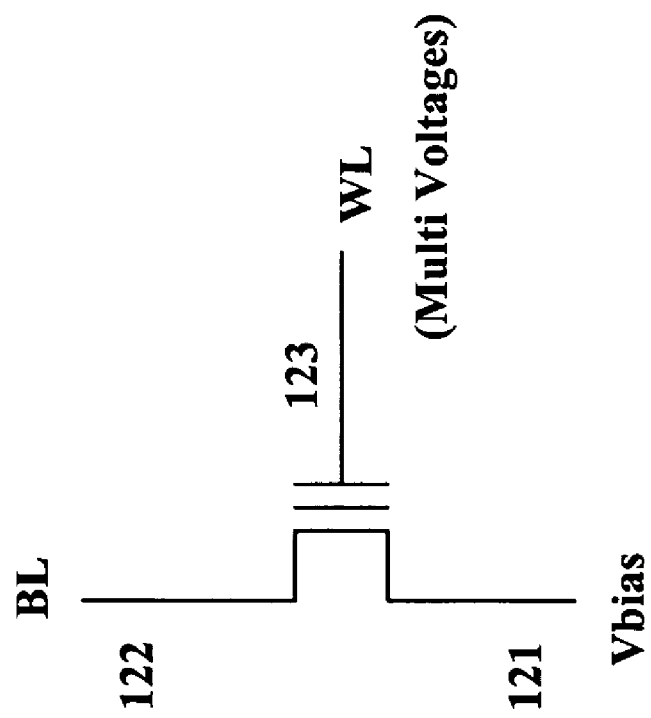
FIG. 24 is a schematic diagram of an equivalent circuit for the structure shown in FIG. 23.

FIG. 23 shows a vertical memory cell with a vertical MOSFET in a stackable add-on layer, where the vertical memory has a floating gate 123k and a control gate 123, and could work as a DRAM and/or a nonvolatile memory device. Nonvolatile memory devices usually have permanent (or relatively long term) charge storage nodes. In this structure, floating gate 123k is the charge storage node. However, when the body region is floating, charge is temporarily stored in the body region (p-doped region) and could be used for DRAM operation. FIG. 24 is a schematic diagram of an equivalent circuit for the structure shown in FIG. 23.

Figure 25:
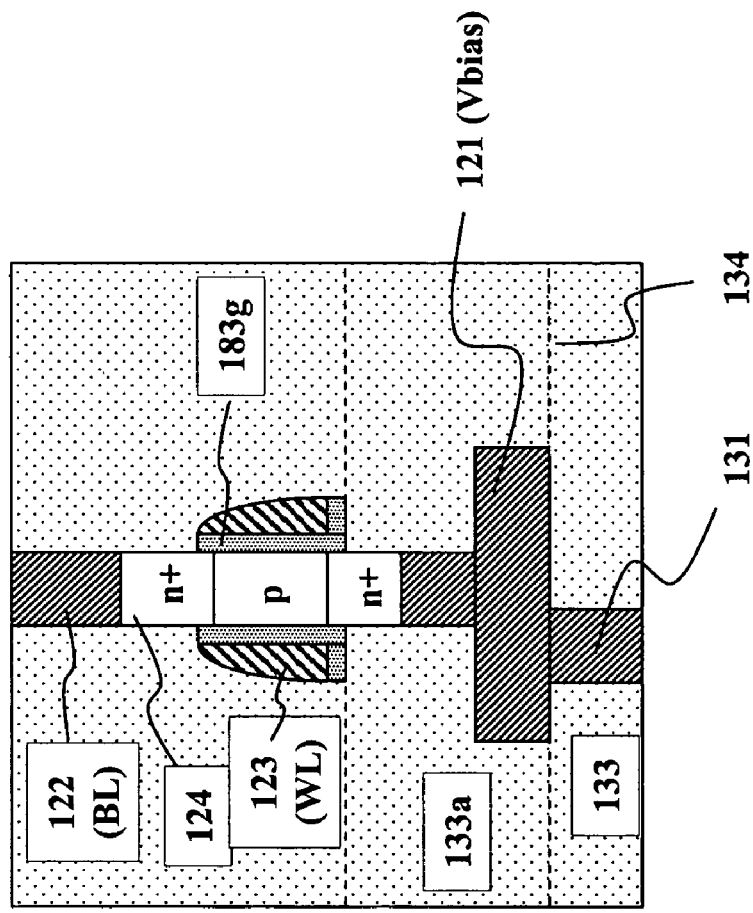
FIG. 25 is a cross-sectional view of an embodiment of the present invention having a vertical memory cell with a vertical MOSFET in the SOI layer, where the vertical memory has a charge-trapping gate insulating layer, and could work as a DRAM and a nonvolatile memory devices.
Figure 26:
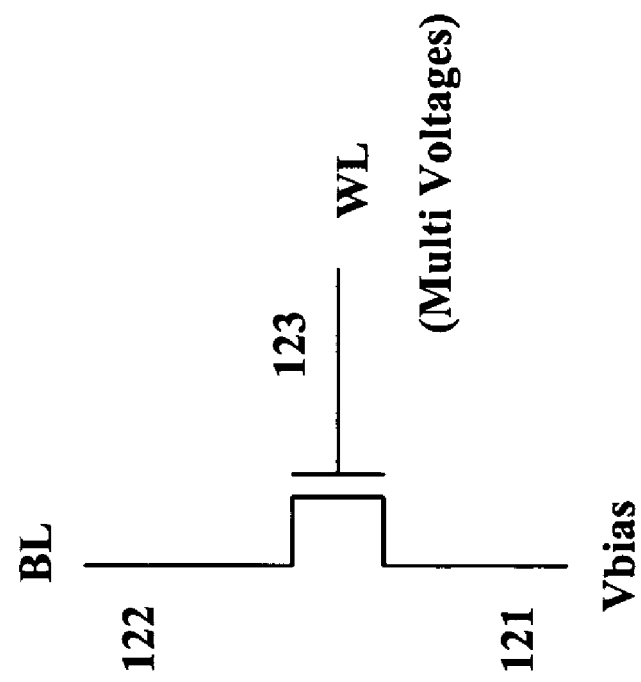
FIG. 26 is a schematic diagram of an equivalent circuit for the structure shown in FIG. 25.

FIG. 25 shows a cross-sectional view of an embodiment of the present invention having a vertical memory cell with a vertical MOSFET in a stackable add-on layer, where the vertical MOSFET of the memory cell has a charge-trapping gate insulating layer. Such a device could work as a DRAM or as a nonvolatile memory device. The charge-trapping gate insulating layer 183g may be, for example, an oxide-nitride-oxide film. This nonvolatile memory device has a permanent (or relatively long term) charge storage node within the oxide-nitride-oxide film, which may have a multi-bit property depending on charge storage location. This structure may be used to create a circuit that works as a DRAM, as explained in connection with FIG. 24. FIG. 26 is a schematic diagram of an equivalent circuit for the structure shown in FIG. 25.

Figure 27:
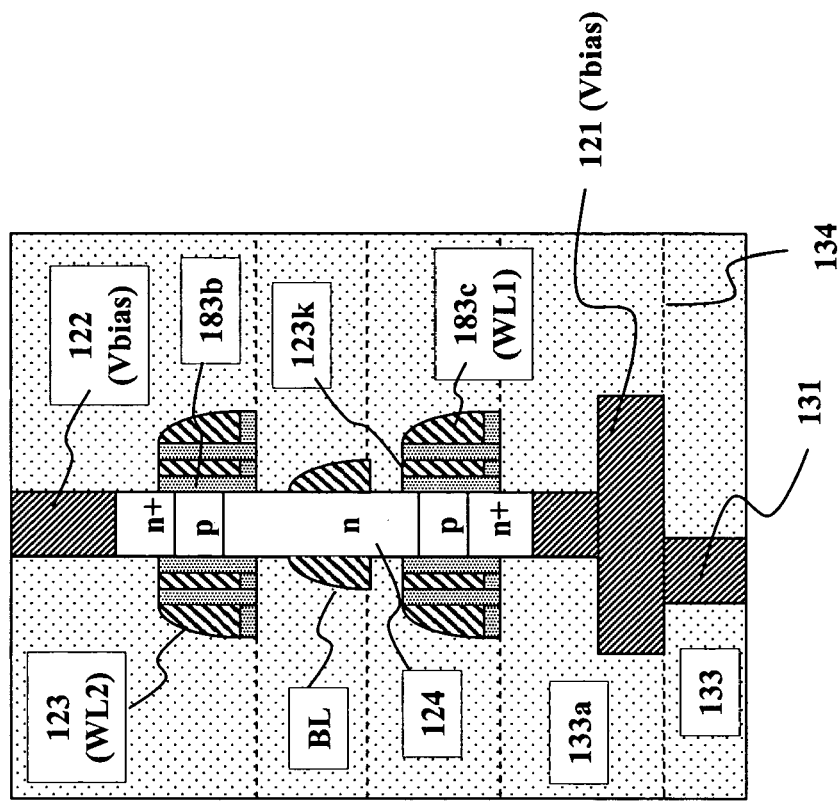
FIG. 27 is a cross-sectional view of an embodiment of the present invention having two vertical memory cells with vertical connection of the two memory cells shown in FIG. 23 in the SOI layer, where the vertical memory could work as a DRAM and a nonvolatile memory devices.
Figure 28:
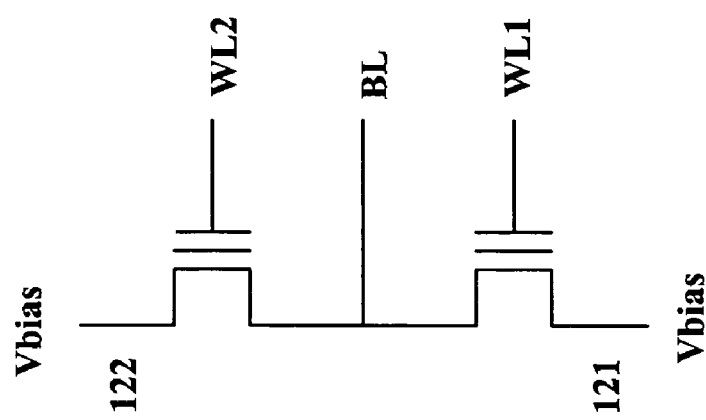
FIG. 28 is a schematic diagram of an equivalent circuit for the structure shown in FIG. 25.

FIG. 27 shows two vertical memory cells (of the type shown in FIG. 23) configured to provide a vertical connection between the two memory cells in a stackable add-on layer. This structure shares a bit line and may reduce aspect ratio of SOI pillar 124. The dual-gate nonvolatile memory cell could be replaced by single-gate nonvolatile memory cell shown in FIG. 25. FIG. 28 is a schematic diagram of an equivalent circuit for the structure shown in FIG. 27.

Figure 29:
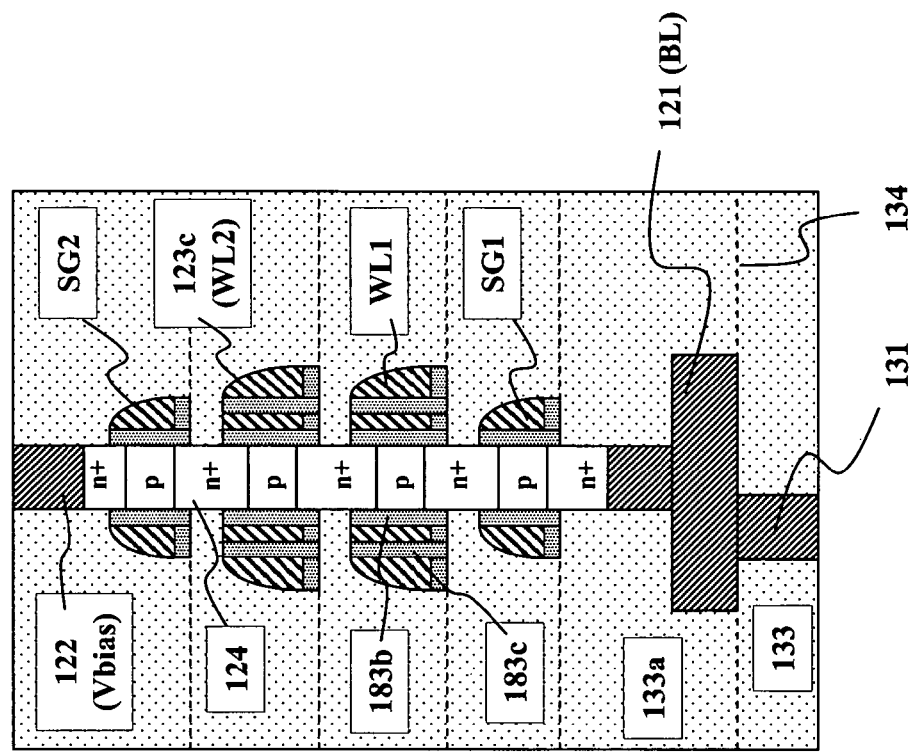
FIG. 29 is a cross-sectional view of an embodiment of the present invention having two vertical memory cells with vertical connection of the two nonvolatile memory cells in the SOI layer.
Figure 30:
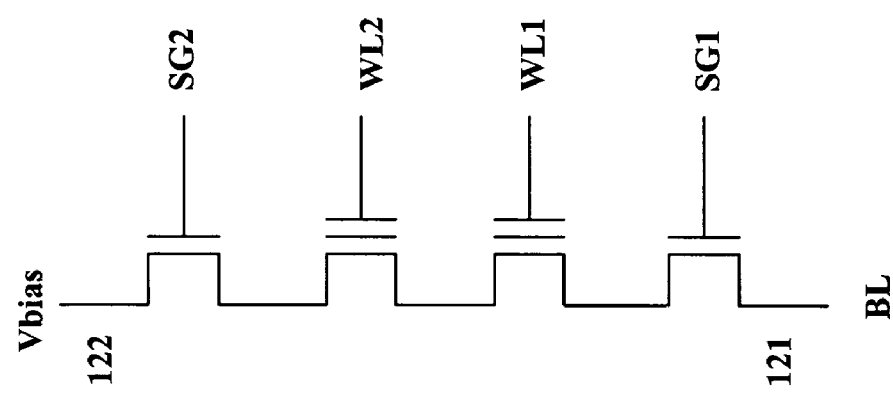
FIG. 30 is a schematic diagram of an equivalent circuit for the structure shown in FIG. 29.

FIG. 29 shows two vertical memory cells with vertical connection of the two nonvolatile memory cells in the stackable add-on layer. Each nonvolatile memory cell has a single-gate select gate (SG) MOSFET and a dual-gate charge storage MOSFET. FIG. 30 is a schematic diagram of an equivalent circuit for the structure shown in FIG. 29.

Figure 31:
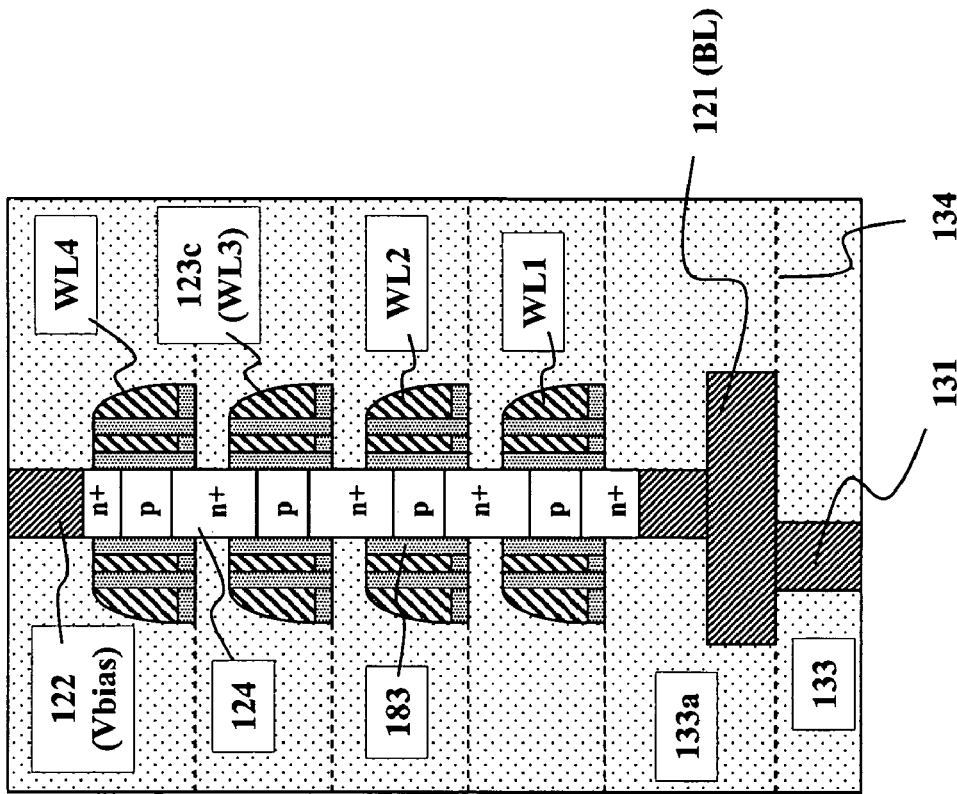
FIG. 31 is a cross-sectional view of an embodiment of the present invention having four vertical memory cells with vertical connection of the four nonvolatile memory cells in the SOI layer.
Figure 32:
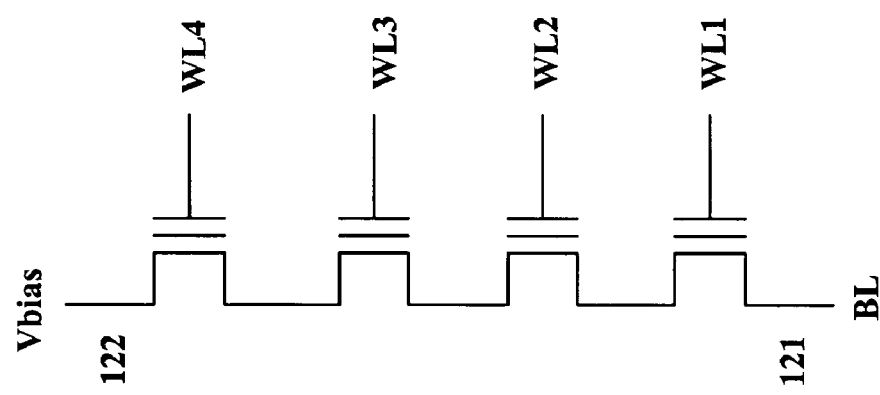
FIG. 32 is a schematic diagram of an equivalent circuit for the structure shown in FIG. 31.

FIG. 31 shows four vertical memory cells with serial connection of the four nonvolatile memory cells in the stackable add-on layer. The nonvolatile could be single-gate instead of dual-gates. FIG. 32 is a schematic diagram of an equivalent circuit for the structure shown in FIG. 31.

Figure 33:
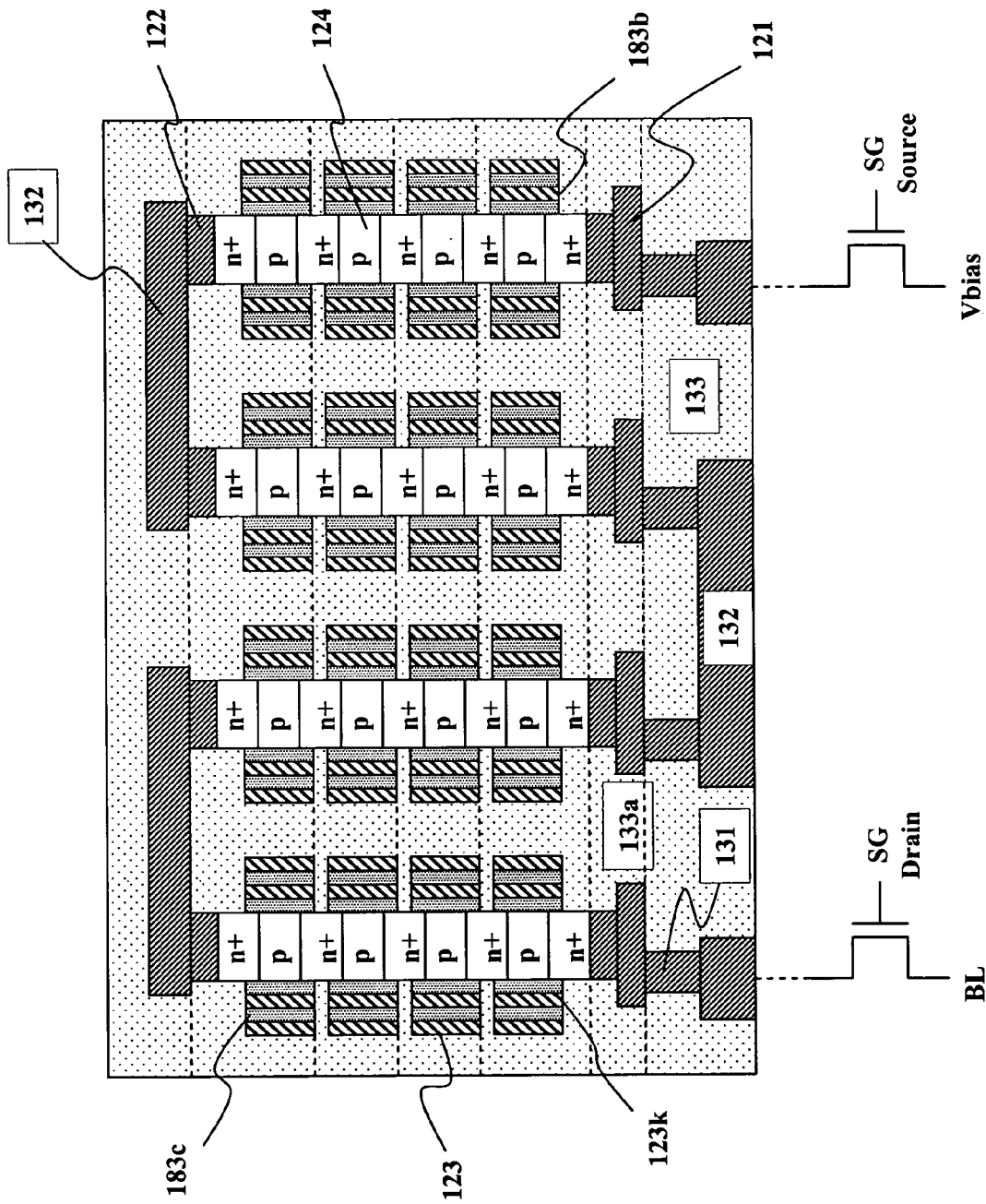
FIG. 33 illustrates an exemplary 16-transistor nonvolatile memory structure formed with devices illustrated in FIG. 31.
Figure 34:
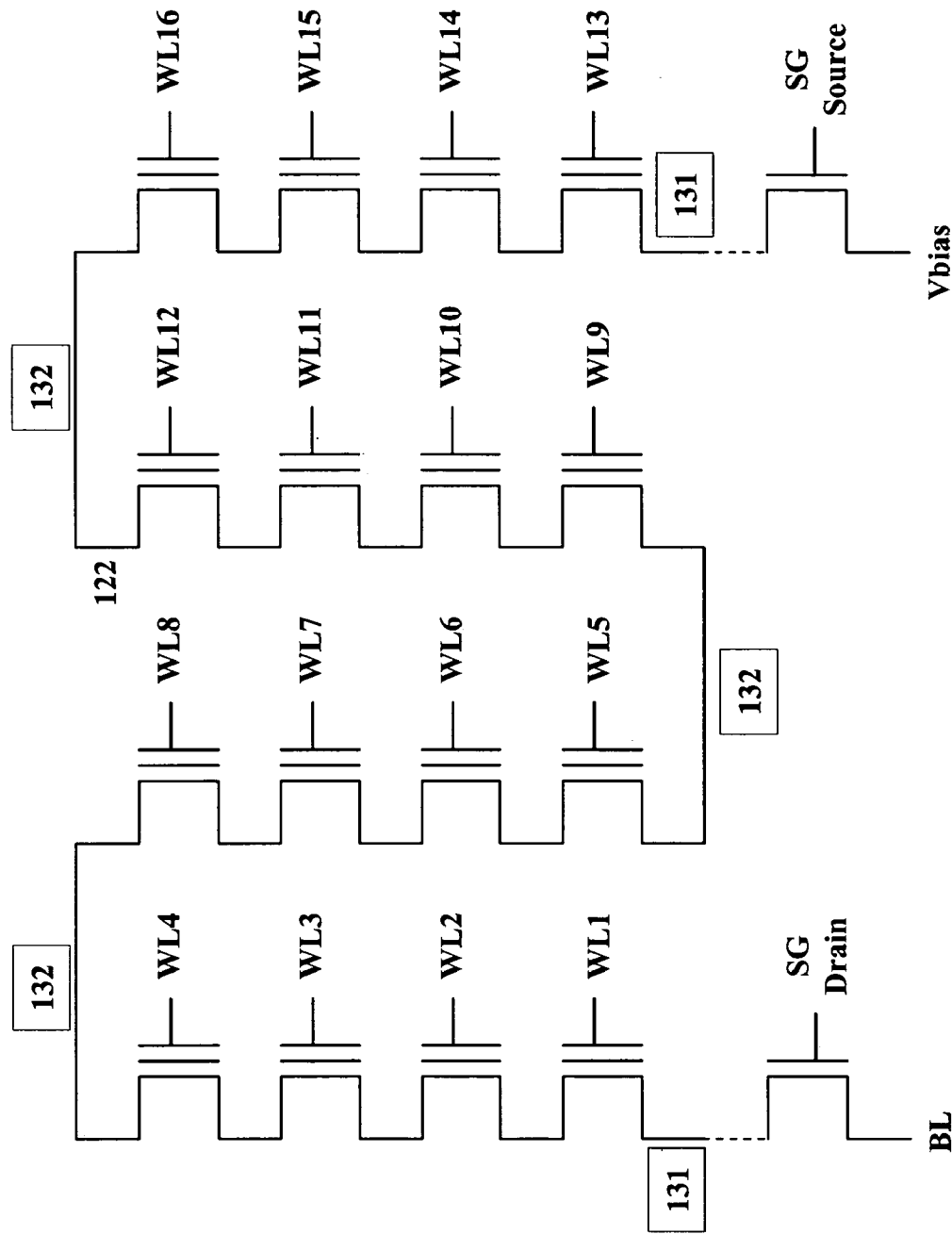
FIG. 34 is a schematic diagram of an equivalent circuit for the structure shown in FIG. 33.

FIG. 33 illustrates an exemplary 16-transistor nonvolatile memory structure formed with devices illustrated in FIG. 31. Such a 16-transistor nonvolatile memory may be part of a NAND architecture flash memory product. This type of NAND-type structure is also suitable for use in logic applications. The select transistors may be placed in base substrate 103 or in stackable add-on layer 101. FIG. 34 is a schematic diagram of an equivalent circuit for the structure shown in FIG. 33.

CONCLUSION

As disclosed herein, vertical DRAM cells have at least one vertical transistor and a capacitor, where the capacitor temporarily stores electric charges and requires refresh. The capacitor could be implemented as an extension of vertical SOI pillar or may be placed outside of the stackable add-on layer, where the capacitor is serially connected to the transistor. Or, as a body part of the vertical transistor, the capacitor could be placed in parallel with a transistor. Dual-port DRAM shares single capacitor and increases memory density.

Vertical SRAM has at least one vertical transistor and a serially connected NDR device, where the NDR may be a Thyristor, charge-trapping MOSFET, or tunneling (or bi-stable) diode.

Vertical nonvolatile memory has a form of either dual-gate with floating gate or single-gate with charge trapping gate insulator. Since the body of SOI pillar is usually floating, the nonvolatile could work as a DRAM device.

Multiple memory cells may be vertically stacked, either in a single stackable add-on layer, or in two or more stacked stackable add-on layers. Since vertically stacked multiple memory cells may share a bit line, the effective aspect ratio of the SOI pillar could be decreased compared with individually stacked memory structure.

All of the memory devices, or cells, described herein may have redundant devices, or cells, in the stackable add-on layer for replacing defective elements thereof.

It is to be understood that the present invention is not limited to the embodiments described above, but encompasses any and all embodiments within the scope of the subjoined Claims.

What is claimed is:

1. A semiconductor memory structure, comprising:
   a substrate having electrical devices formed therein, and further having at least one dielectric layer and at least one interconnect layer disposed above the substrate; and
   a first stackable add-on layer, the first stackable add-on layer including a plurality of vertically oriented semiconductor memory cells disposed within the first stackable add-on layer, the plurality of vertically oriented semiconductor memory cells separated from each other by dielectric material;
   wherein the stackable add-on layer is bonded to a layer of the substrate that is the greatest distance from the substrate as measured from the bottom surface of the substrate; and
   wherein the memory cell is a DRAM having at least one transistor.

2. The semiconductor memory structure of claim 1, wherein the vertically oriented memory cell comprises a vertical transistor and a serially connected capacitor in a SOI pillar.

3. The semiconductor memory structure of claim 1, wherein the vertically oriented semiconductor memory cell comprises a vertical transistor in an SOI pillar and a capacitor connected in series therewith, the capacitor disposed external to the first stackable add-on layer.

4. The semiconductor memory structure of claim 1, wherein the vertically oriented semiconductor memory cell comprises:
a first capacitor,
a first access transistor serially connected to the first capacitor,
a second access transistor serial connected to the first access transistor, and
a second capacitor serially connected to the second access transistor;
wherein the first capacitor, the first access transistor, the second access transistor, and the second capacitor are all formed in a single vertically oriented SOI pillar.

5. The semiconductor memory structure of claim 1, wherein the vertically oriented semiconductor memory cell comprises two vertically oriented, serially connected transistors formed on a SOI pillar, the serially connected transistors further connected to a capacitor disposed external to the stackable add-on layer.

6. The semiconductor memory structure of claim 1, wherein the vertically oriented semiconductor memory cell comprises two vertically and serially connected transistors and a shared serially connected capacitor in a SOI pillar.

7. The semiconductor memory structure of claim 1, wherein the vertically oriented semiconductor memory cell comprises:
a first diode;
a first access transistor connected in series to the first diode;
a second access transistor connected in series to the first access transistor;
a third access transistor connected in series to the second access transistor; a fourth access transistor connected in series to the third access transistor; and
a second diode connected in series to the fourth access transistor;
wherein the first diodes the first, second, third, and fourth transistors, and the second diode are formed on the same SOI pillar.

8. A semiconductor memory structure, comprising:
a substrate having electrical devices formed therein, and further having at least one dielectric layer and at least one interconnect layer disposed above the substrate;
a first stackable add-on layer, the first stackable add-on layer including a plurality of vertically oriented semiconductor memory cells disposed within the first stackable add-on layer, the plurality of vertically oriented semiconductor devices separated from each other by dielectric material; and
wherein the stackable add-on layer is bonded to a layer of the substrate that is the greatest distance from the substrate as measured from the bottom surface of the substrate; and
wherein the memory cell is an SRAM having at least one Negative Differential Resistance device.

9. The semiconductor memory structure of claim 8, wherein the vertically oriented semiconductor memory cell comprises a vertically oriented transistor and a vertically oriented NDR-type Thyristor serially connected to each other.

10. The semiconductor memory structure of claim 9, wherein the vertically oriented transistor is formed on an SOI pillar and the vertically NDR-type Thyristor is formed on an SOI pillar.

11. The semiconductor memory structure of claim 9, wherein the vertically oriented transistor and the vertically NDR-type Thyristor are formed on two separated SOI pillars.

12. The semiconductor memory structure of claim 8, wherein the vertically oriented transistor and the vertically NDR-type Thyristor are formed on the same SOI pillar.

13. A semiconductor memory structure, comprising:
a substrate having electrical devices formed therein, and further having a dielectric layer disposed above the electrical devices;
a stackable add-on layer having a plurality of vertically oriented semiconductor memory cells; and
the stackable add-on layer being bonded to the dielectric layer; and
wherein the memory cells are nonvolatile memory cells having at least one transistor.

14. The semiconductor memory structure of claim 13, wherein the vertically oriented semiconductor nonvolatile memory cell comprises a vertical transistor having a floating gate and a control gate on a SOI pillar.

15. The semiconductor memory structure of claim 13, wherein the vertically oriented semiconductor nonvolatile memory cell comprises a vertical transistor having a charge-trapping gate insulator and a gate on a SOI pillar.

16. The semiconductor memory structure of claim 13, wherein at least two nonvolatile memory cells are vertically oriented and serially connected together and formed with a first SOI pillar.

17. The semiconductor memory structure of claim 16, wherein the at least two nonvolatile memory cells on the first SOI pillar are serially connected with an interconnect line disposed on a dielectric layer, to a nonvolatile memory cell formed with a second SOI pillar.

* * * * *